United States Patent
Sotoyama et al.

(10) Patent No.: US 6,773,832 B2
(45) Date of Patent: Aug. 10, 2004

(54) ORGANIC ELECTROLUMINESCENT ELEMENT AND ORGANIC ELECTROLUMINESCENCE DISPLAY USING THE SAME

(75) Inventors: Wataru Sotoyama, Kawasaki (JP); Hiroyuki Sato, Kawasaki (JP); Azuma Matsuura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/745,671

(22) Filed: Dec. 29, 2003

(65) Prior Publication Data

US 2004/0137272 A1 Jul. 15, 2004

Related U.S. Application Data

(63) Continuation of application No. PCT/JP02/06517, filed on Jun. 27, 2002.

(30) Foreign Application Priority Data

Jun. 27, 2001 (JP) ........................................ 2001-195322

(51) Int. Cl.[7] .............................................. H05B 33/14
(52) U.S. Cl. ...................... 428/690; 428/917; 313/504; 313/506; 257/88; 257/102; 257/103
(58) Field of Search ................................ 428/690, 917; 313/504, 506; 257/88, 102, 103

(56) References Cited

FOREIGN PATENT DOCUMENTS

| JP | 5-214334 | 8/1993 |
| JP | 10-088120 | 4/1998 |
| JP | 2000-58261 | 2/2000 |

*Primary Examiner*—Marie Yamnitzky
(74) *Attorney, Agent, or Firm*—Staas & Halsey LLP

(57) ABSTRACT

An organic EL element, wherein a material comprising an arylaminozethrene compound represented by the following general formula is used as the material of a light emitting layer:

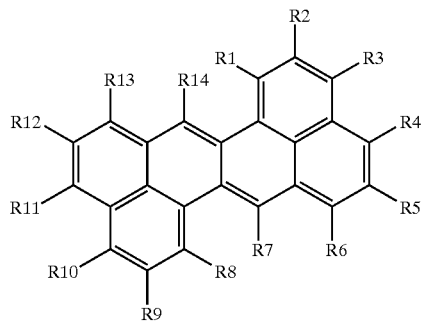

wherein at least one of R1 to R14 is an arylamino group of the formula —NRR' or —NR$_2$ (R represents a substituted or unsubstituted aromatic group having a single aromatic ring or a condensed aromatic ring with up to five rings, and R' represents H, halogen, —OH, —OCH$_3$, or an alkyl group), and others represent H, halogen, —OH, —OCH$_3$, alkyl, or an aforementioned substituted or unsubstituted aromatic group.

14 Claims, 4 Drawing Sheets

ORGANIC ELECTROLUMINESCENT ELEMENT AND ORGANIC ELECTROLUMINESCENCE DISPLAY USING THE SAME

CROSS-REFERENCES TO RELATED APPLICATIONS

This application is based upon and claims the benefit of priority from prior Japanese Patent Application No. 2001-195322, filed on Jun. 27, 2001, the entire contents thereof being incorporated herein by reference, and is a continuation of PCT/JP02/06517.

TECHNICAL FIELD

The present invention relates to an organic electroluminescent element (EL element) and an organic EL display using the same.

BACKGROUND ART

An organic EL element has features such as spontaneous emission (the backlight used in a liquid crystal element is not required) and high-speed response and its application to a flat panel display is expected.

In case of realizing a full color display panel using an organic EL element, it is required to prepare organic EL elements each emitting light of one of three primary colors (blue, green or red). For a red light emitting organic EL element, among these elements, a DCM pigment as described in C. W. Tang, S. A, Vanslyke, and C. H. Chen, Journal of Applied Physics, Vol. 65, 3610 (1989) has been used, however, further improvement in emission color and emission efficiency is required.

There is an example wherein a porphin or porphyrin compound capable of emitting red fluorescence is used as a light emitting material so as to obtain a red light emitting EL element (Japanese Unexamined Patent Publication (Kokai) No. 9-13024, Japanese Unexamined Patent Publication (Kokai) No. 9-296166, Japanese Unexamined Patent Publication (Kokai) No. 11-251061, Japanese Unexamined Patent Publication (Kokai) No. 11-251062, and Domestic Re-Publication of PCT International Application No. 98/000474).

Japanese Unexamined Patent Publication (Kokai) No. 11-144868 discloses a red light emitting organic EL element using a bisanthrene compound.

Furthermore, Japanese Unexamined Patent Publication (Kokai) No. 5-214334 discloses an organic EL element using zethrene or a derivative thereof, but does not disclose the use of, a monoarylaminozethrene or diarylaminozethrene compound as a zethrene derivative.

DISCLOSURE OF THE INVENTION

The traditional red light emitting EL elements are insufficient in emission efficiency and emission color purity as compared with blue and green light emitting EL elements and further improvement is required.

An object of the present invention is to provide a red light emitting organic EL element having high emission efficiency, and high color purity and an organic EL display using the same, by studying the light emitting material molecules contained in an organic EL element.

The present inventors have intensively studied the object described above and found that an organic EL element produced by using a certain monoarylaminozethrene or diarylaminozethrene compound as a light emitting material emits light with higher luminance as compared with the prior art.

It has also been found that the material has high carrier transporting properties, and that an organic EL element produced by using the material as a hole transporting material or an electron transporting material, and an organic EL element produced by using a thin film made of a mixture of the material and another hole transporting material or electron transporting material, also emit light with higher luminance as compared with the prior art.

The organic electroluminescent (EL) element of the present invention is an organic EL element having a positive electrode, a negative electrode, and an organic light emitting layer located between the positive electrode and the negative electrode, characterized by the material of the organic light emitting layer comprising an arylaminozethrene compound represented by the following general formula:

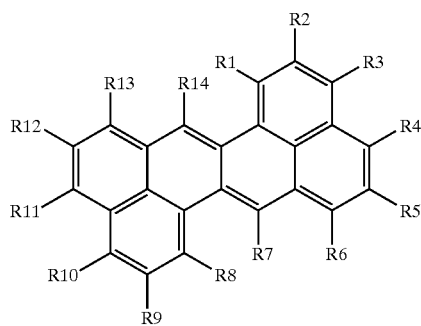

wherein at least one of R1 to R14 is an arylamino group represented by the following structural formula:

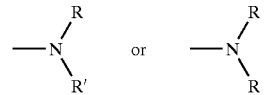

wherein R is a substituted or unsubstituted aromatic group having a single aromatic ring or a condensed aromatic ring with up to five rings, the substituent containing at least one kind of atoms selected from carbon, oxygen, nitrogen and sulfur atoms in case of the substituted aromatic group, the total numbers of atoms other than hydrogen in the substituted aromatic group being not more than 25, and R' is hydrogen, halogen, —OH, —OCH$_3$, or an alkyl group having 1 to 10 carbon atoms, and, when the arylaminozethrene compound includes two or more arylamino groups, they may be the same or different, and groups other than the arylamino group among R1 to R14 independently represents hydrogen, halogen, —OH, —OCH$_3$, an alkyl group having 1 to 10 carbon atoms, or the substituted or unsubstituted aromatic group as aforementioned.

The present invention also provides an organic EL display using the organic EL element of the present invention.

More specifically, the organic EL display of the present invention includes a substrate, an organic EL layer including the organic EL elements of the present invention provided on the substrate, and a circuit for driving the organic EL elements included in the organic EL layer.

BEST MODE FOR CARRYING OUT THE INVENTION

Figure 1:
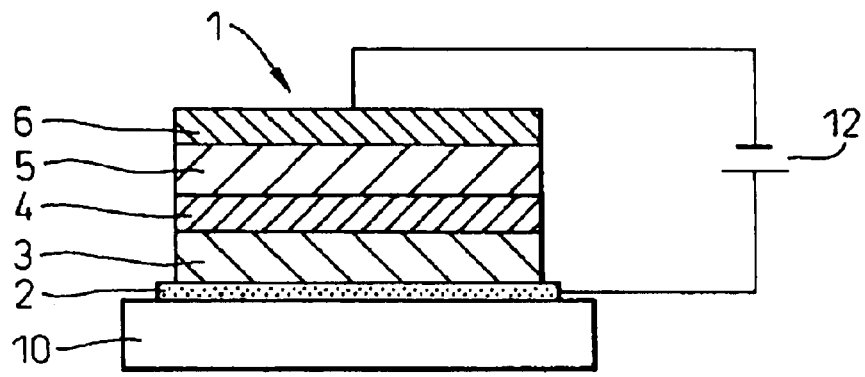
FIG. 1 is a view illustrating an example of an organic EL element according to the present invention.

In the organic electroluminescence (EL) element of the present invention, an organic light emitting layer located between a positive electrode and a negative electrode is made of a material comprising an arylaminozethrene compound represented by the general formula described below, thereby realizing emission of red light having high emission efficiency and high color purity.

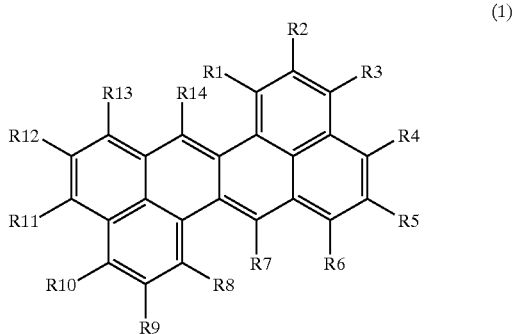

(1)

wherein at least one of R1 to R14 is an arylamino group represented by the following structural formula:

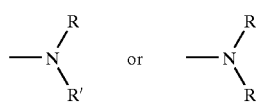

(2)

wherein R is a substituted or unsubstituted aromatic group having a single aromatic ring or a condensed aromatic ring with up to five rings, the substituent containing at least one kind of atoms selected from carbon, oxygen, nitrogen and sulfur atoms in case of the substituted aromatic group, the total numbers of atoms other than hydrogen atoms in the substituted aromatic group being not more than 25, and R' represents hydrogen, halogen, —OH, —OCH$_3$, or an alkyl group having 1 to 10 carbon atoms, and, when the arylaminozethrene compound has two or more arylamino groups, they may be the same or different, and groups other than the arylamino group among R1 to R14 independently represents hydrogen, halogen, —OH, —OCH$_3$, an alkyl group having 1 to 10 carbon atoms, or aforementioned substituted or unsubstituted aromatic group.

The arylaminozethrene compound of the formula (1) used in the present invention has at least one arylamino group represented by the formula (2) in the molecule. The aryl substituent R in the arylamino group may be a monocyclic aromatic, group, that is, a phenyl group, or a condensed ring aromatic group with up to five rings, for example, a naphthyl or an anthryl group. Also the aryl substituent R may be a substituted monocyclic aromatic group or substituted condensed ring aromatic group with up to five rings, which is derived from the aforementioned monocyclic or condensed ring aromatic group, and the substituent in this case can contain any of carbon, oxygen, nitrogen and sulfur atoms and the aryl substituent R has 25 atoms other than hydrogen atoms (carbon, oxygen, nitrogen and sulfur atoms) at most. In the organic EL element of the present invention, a light emitting layer made of a material containing a mixture of two or more kinds of arylaminozethrene compounds can also be used.

The arylamino group of the arylaminozethrene compound may be either a group having one aryl substituent R and one non-aryl substituent R' (monoarylamino group) or a group having two aryl substituents R (diarylamino group). The arylaminozethrene compound can have one arylamino group, or two or more arylamino groups in the molecule. If two or more arylamino groups are present in the molecule, they may be the same or different.

The arylaminozethrene compound used in the present invention can be prepared easily by substituting zethrene with a predetermined substituent. For example, zethrene can be obtained by the method described in Journal of the American Chemical Society, Vol. 90, page 530 (1968). The substituent can be introduced into zethrene by any method, for example, a method of first brominating zethrene and subsequently substituting the bromine with a predetermined arylamino group.

The light emitting layer of the organic EL element according to the present invention is formed of a material containing the aforementioned arylaminozethrene compound. The thickness of the light emitting layer is within a range from 1 to 80 nm, and preferably from 5 to 30 nm. The material for light emitting layer can optionally contain a component other than the arylaminozethrene compound. For example, when using the arylaminozethrene compound alone, it sometimes becomes difficult to satisfactorily form a light emitting layer because of poor film forming properties. It is possible to ensure film forming properties while maintaining good light emitting properties by mixing an arylaminozethrene compound, which is a guest material, as an emission pigment, with a host material to form a light emitting layer.

More specifically, a mixture of an arylaminozethrene compound, which is a light emitting pigment, and a host material having excitation energy larger than that of the compound (i.e., a material having a light-absorption end at a wavelength shorter than that of the arylaminozethrene compound) is used as the material of the light emitting layer. When a fluorescence emission spectrum of the host material is within the same wavelength region as that of the absorption spectrum of the arylaminozethrene compound, which is the guest material, it becomes possible to effectively transfer excitation energy from the host to the guest, and thus light is efficiently emitted from the guest material, seldom or never causing light emission of the host material, to obtain an emission color having good purity.

The host material may be composed of one kind of a material, or may be composed of a mixture of two or more kinds of materials. For example, when using two kinds of host materials, even if effective overlap between a fluorescence emitting wavelength of one host material (host material 1) and an absorption wavelength of a guest material is not recognized, energy transfer of (host material 1→host material 2→guest material) efficiently occurs by mixing with another host material (host material 2) which absorbs light within the light emitting wavelength region of the material 1 to emit fluorescence within the absorption wavelength region of the guest material, thus obtaining emission of light having high efficiency and good emission color purity from the guest material.

Examples of the host material, which can be used in the light emitting layer of the organic EL element according to the present invention, can include aluminum-quinolinol complex such as tris(8-quinolato)aluminum (Alq) of the following formula:

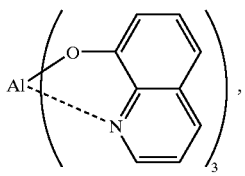

rubrene of the following formula:

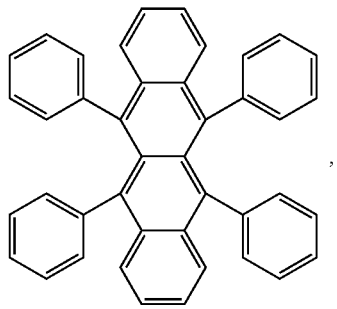

and bis(benzoquinolato)beryllium complex of the following formula:

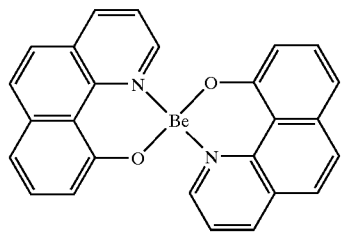

The organic EL element of the present invention may be a "single-layer type" element having only a light emitting layer comprising an arylaminozethrene compound between a positive electrode and a negative electrode, or may be a "multi-layer type" element having a light emitting layer and at least one layer, other than the light emitting layer, between a positive electrode and a negative electrode. Examples of the layer, other than the light emitting layer, of the multi-layer type element can include hole injecting layer, hole transporting layer, electron injecting layer and electron transporting layer. In some case, the light emitting layer can also serve as a hole transporting layer or an electron transporting layer.

Examples of layer configuration, which are possible in the organic EL element of the present invention, are as follows:

positive electrode/hole injecting layer/hole transporting layer/light emitting layer/electron transporting layer/ electron injecting layer/negative electrode;

positive electrode/hole injecting layer/hole transporting layer/light emitting layer/electron transporting layer/ negative electrode;

positive electrode/hole transporting layer/light emitting layer/electron transporting layer/electron injecting layer/ negative electrode;

positive electrode/hole transporting layer/light emitting layer/electron transporting layer/negative electrode;

positive electrode /hole injecting layer/hole transporting layer/light emitting layer-cum-electron transporting layer/ electron injecting layer/negative electrode;

positive electrode/hole injecting layer/hole transporting layer/light emitting layer-cum-electron transporting layer/ negative electrode;

positive electrode/hole transporting layer/light emitting layer-cum-electron transporting layer/electron injecting layer/negative electrode;

positive electrode/hole transporting layer/light emitting layer-cum-electron transporting layer/negative electrode;

positive electrode/hole injecting layer/hole transporting layer-cum-light emitting layer/electron transporting layer/ electron injecting layer/negative electrode;

positive electrode/hole injecting layer/hole transporting layer-cum-light emitting layer/electron transporting layer/ negative electrode;

positive electrode/hole transporting layer-cum-light emitting layer/electron transporting layer/electron injecting layer/ negative electrode;

positive electrode/hole transporting layer-cum-light emitting layer/electron transporting layer/negative electrode; and positive electrode/light emitting layer/negative electrode.

Describing constituent features other than the light emitting layer described previously, a positive electrode can be made of ITO (oxide of indium-tin alloy), tin oxide, indium oxide or the like, and has a thickness of within a range from 1 to 5000 nm, and preferably from 20 to 200 nm.

A hole injecting layer can be made of copper phthalocyanine, polyaniline, star-burst amine represented by the following formula:

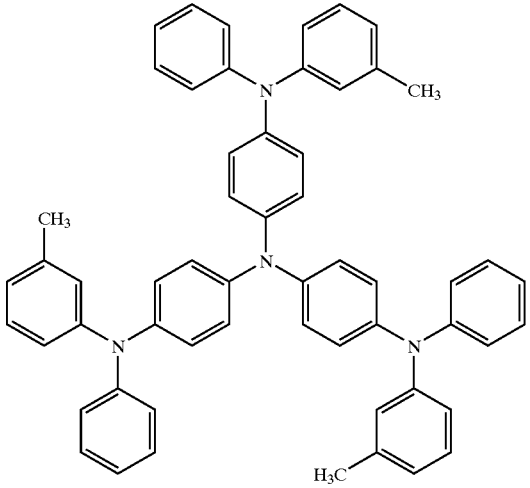

or the like, and has a thickness of within a range from 1 to 100 nm, and preferably from 5 to 50 nm.

A hole transporting layer can be made of an aromatic amine, such as TPD (N,N-diphenyl-N,N'-bis(3-methylphenyl)-[1,1'-biphenyl]-4,4'-diamine) represented by the following formula:

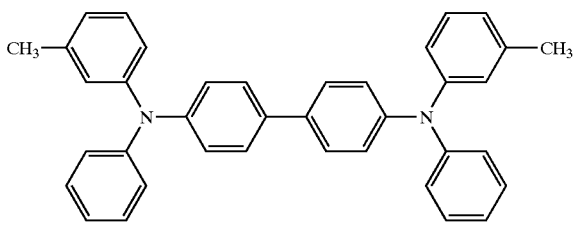

and NPD (N,N'-dinaphthyl-N,N'-diphenyl-[1,1'-biphenyl]-4,4'-diamine) represented by the following formula:

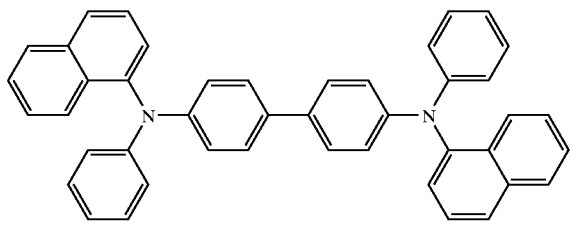

Alternatively, the hole transporting layer can also be made of polyvinyl carbazole or the like. The thickness of the hole transporting layer is within a range from 1 to 500 nm, and preferably from 10 to 100 nm.

An electron transporting layer can be made of quinoline derivatives such as organometal complex containing 8-quinolinol or a derivative thereof as a ligand, such as tris(8-quinolato)aluminum represented by the following formula:

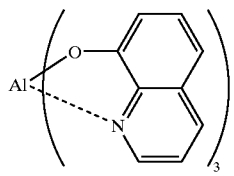

oxadiazole derivatives, triazole derivatives, phenanthroline derivatives, perylene derivatives, pyridine derivatives, pyrimidine derivatives, quinoxaline derivatives, diphenylquinone derivatives, nitro-substituted fluorene derivatives or the like. The thickness of the electron transporting layer is within a range from 1 to 500 nm, and preferably from 10 to 50 nm. The electron transporting layer may be formed of two or more layers made of the above materials.

An electron injecting layer can be made of an alkali metal fluoride such as lithium fluoride, an alkali earth metal fluoride such as strontium fluoride, or the like and has a thickness of within a range from 0.1 to 10 nm, and preferably from 0.5 to 2 nm.

A negative electrode can be made of aluminum, magnesium, calcium, lithium, indium, silver, an alloy thereof or the like and has a thickness of within a range from 1 to 10000 nm, and preferably from 20 to 200 nm.

A light emitting layer-cum-hole transporting layer, or a light emitting layer-cum-electron transporting layer can be formed of the same material as used in the light emitting layer, that is, a material comprising an arylaminozethrene compound.

Any of the respective layers constituting the organic EL element of the present invention can be formed by employing a vacuum deposition method. These layers can also be formed by the method other than the vacuum deposition method and, for example, a spin coating method can be employed. For example, when using polyvinyl carbazole as the material of the hole transporting layer, the spin coating method can be preferably used.

An example of an organic EL element according to the present invention is schematically shown in FIG. 1. As shown in the drawing, the organic EL element 1 of the present invention has a positive electrode 2, a hole transporting layer 3, a light emitting layer 4, an electron transporting layer 5 and a negative electrode 6 formed in this order on a substrate 10 made of glass or the like, the positive electrode 2 and the negative electrode 6 being connected to a power source 12. As described previously, it is essential that the organic EL element of the present invention has the positive electrode 2, the light emitting layer 4 and the negative electrode 6, the element optionally comprising the hole transporting layer 3 and the electron transporting layer 5, and being capable of adopting various layer configurations in addition to that shown in FIG. 1.

The organic EL element of the present invention emits red light having high color purity and can be used in a passive matrix panel type or active matrix panel type organic EL display. Such an organic EL display itself is well known as described, for example, in "Nikkei Electronics", No. 765, the Mar. 13, 2000 issue, pages 55 to 62 (Nikkei Business Publications, Inc.).

Examples of the coloration method of the organic EL display include:

(1) a three-color light emitting method of disposing organic EL elements each emitting red, green or blue light on a substrate, (2) a white color method of separating white light from a white light emitting organic EL element into three primary colors through a color filter, and (3) a color conversion method of converting blue light from a blue light emitting organic EL element into red and green colors through a fluorescent pigment layer, (see, for example, "Monthly Display", the September 2000 issue, pages 33 to 37). The red light emitting element of the present invention can be preferably used for a color panel according to a three-color light emitting method among them.

The panel according to the three-color light emitting method requires organic EL elements emitting light of each one of red, green and blue colors of three primary colors. As the light emitting elements other than the red light emitting element of the present invention, for example, a combination of ITO (positive electrode)/NPD/Alq/Al—Li alloy (negative electrode) can be used for green light emission and a combination of ITO (positive electrode)/NPD/DPVBi/Alq/Al—Li alloy (negative electrode) can be used for blue light emission. DPVBi among materials constituting a blue light emitting element is a compound represented by the following

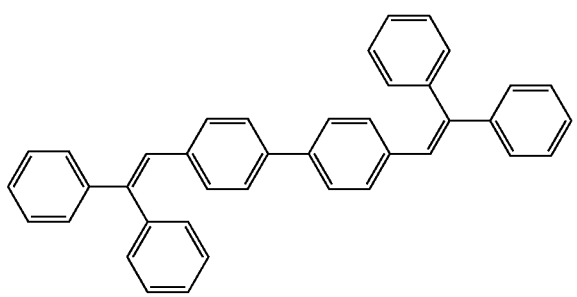

Although a display itself using organic EL elements is well known as described above, a display using the red light emitting organic EL element of the present invention according to a three-color light emitting method will now be described briefly.

Figure 2:
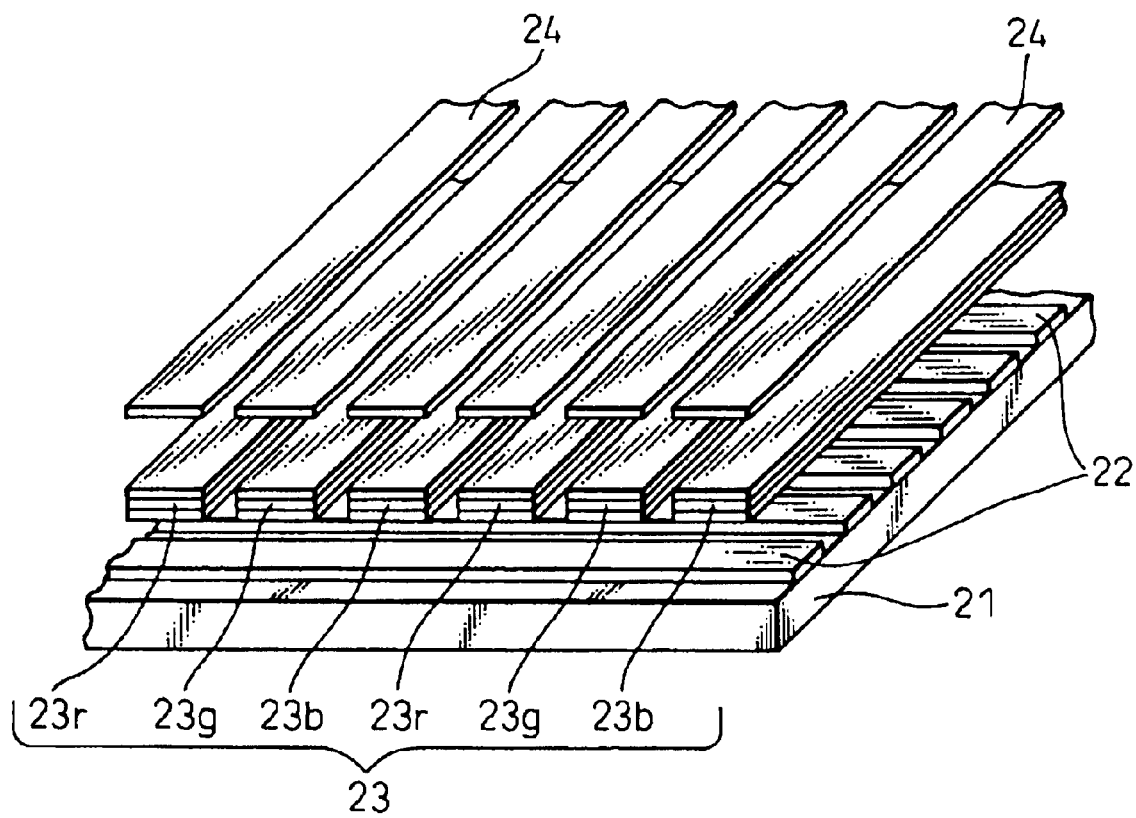
FIG. 2 is a view showing a passive matrix panel display using organic EL elements according to the present invention.
Figure 3:
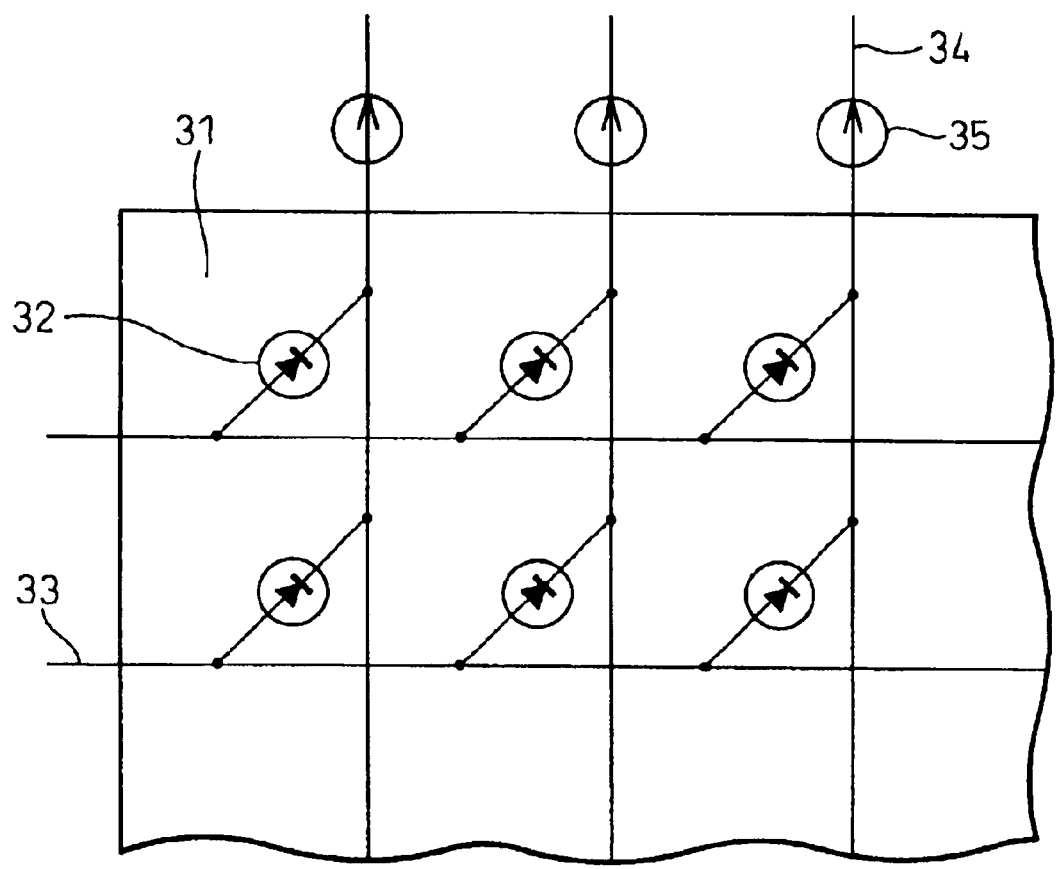
FIG. 3 is a view illustrating a constitutional example of a circuit for panel display shown in FIG. 2.

First, a partially exploded perspective view of a passive matrix panel display is shown in FIG. 2 and a constitutional example of a circuit used to drive this display is shown in FIG. 3. The passive matrix panel display shown in FIG. 2 includes a glass substrate 21, positive electrodes (row electrodes) 22 made of ITO located thereon, an organic EL layer 23 composed of EL elements 23r, 23g and 23b each emitting red, green or blue light disposed on the positive electrodes 22 (the organic EL element of the present invention is used as the red light emitting element 23r among these EL elements), and metal negative electrodes (column electrodes) 24 located on the organic EL layer 23. In the circuit diagram shown in FIG. 3, the numerical reference 31 denotes a panel substrate, 32 denotes an EL element, 33 denotes a positive electrode line, 34 denotes a negative electrode line and 35 denotes a constant current source, respectively.

Figure 4:
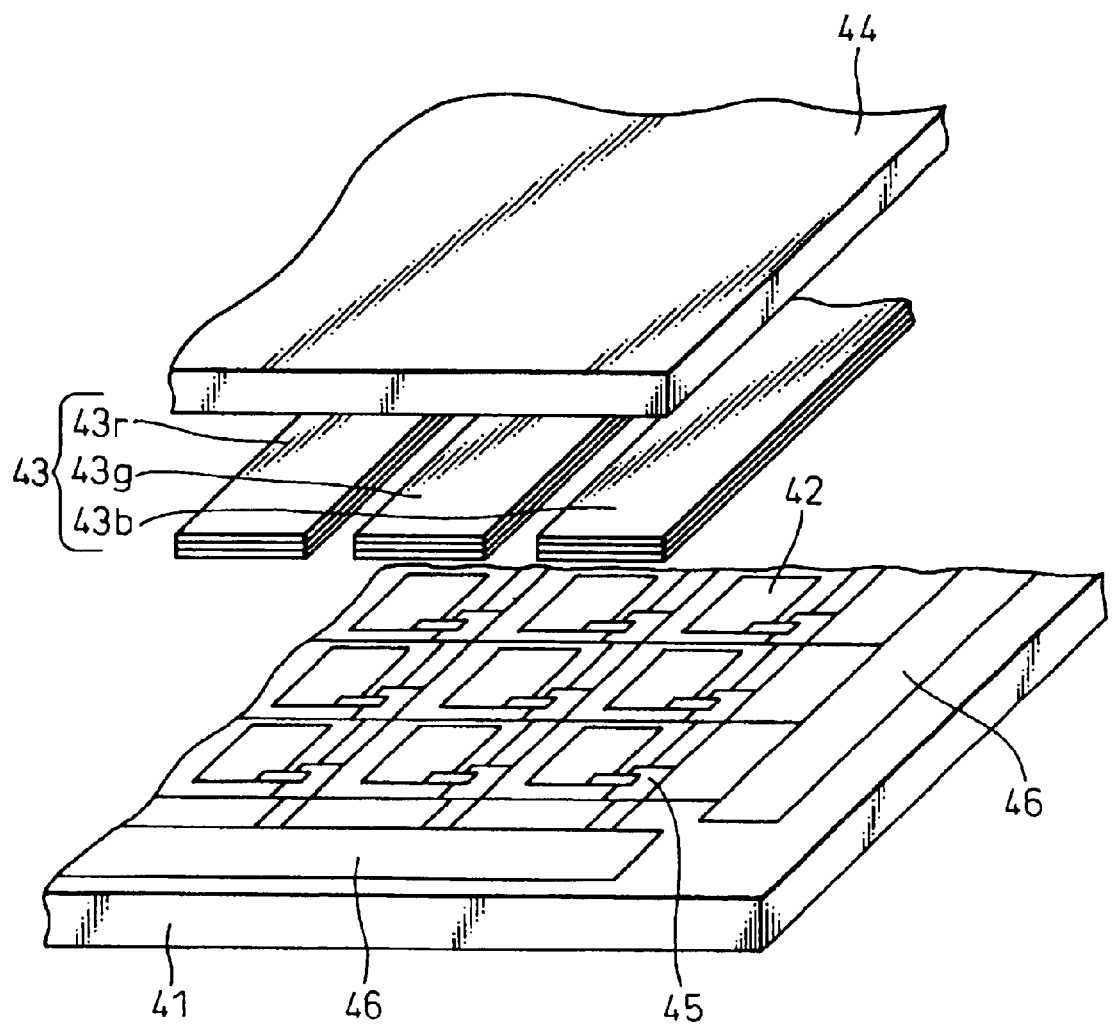
FIG. 4 is a view illustrating an active matrix panel display using organic EL elements according to the present invention.
Figure 5:
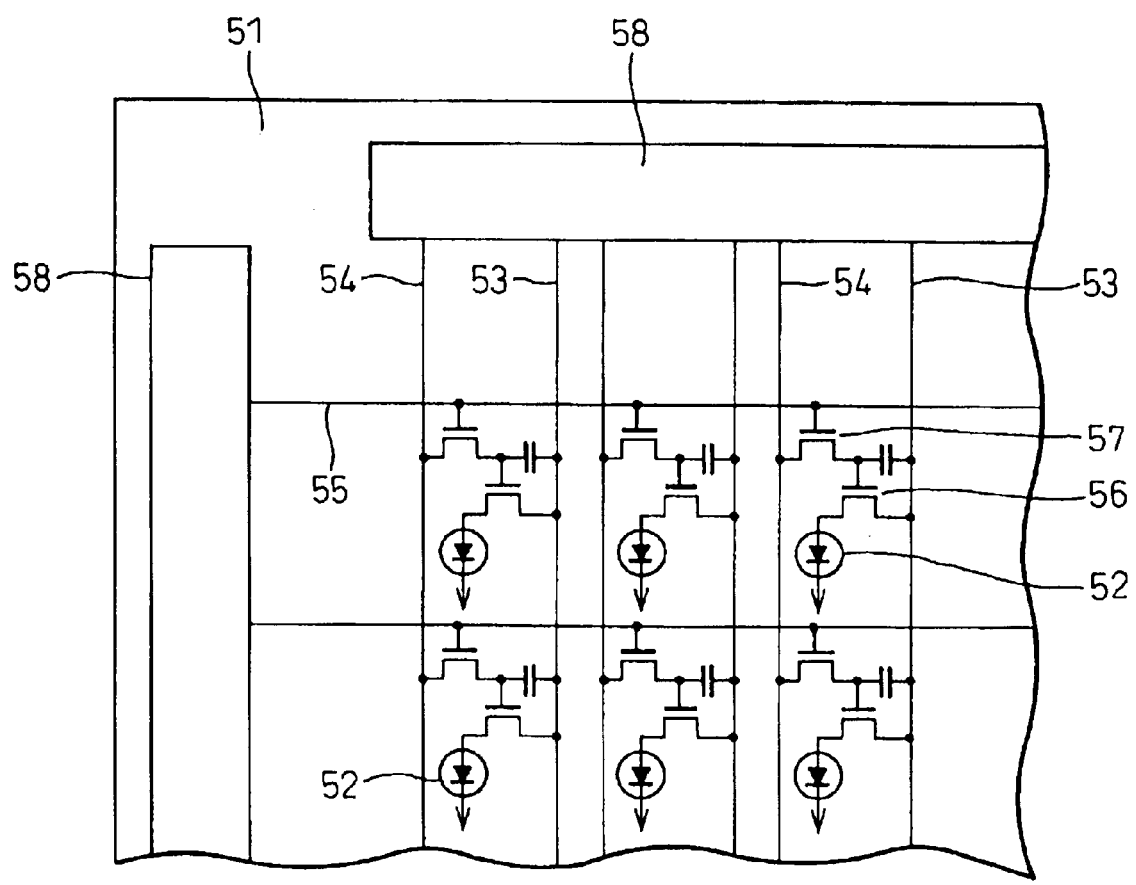
FIG. 5 is a view showing a constitutional example of a circuit for panel display shown in FIG. 4.

Next, a partially exploded perspective view of an active matrix panel display is shown in FIG. 4 and a constitutional example of a circuit which drives the display is shown in FIG. 5. The active matrix panel display in FIG. 4 includes a glass substrate 41, positive electrodes 42 made of, for example, ITO located thereon, an organic EL layer 43 composed of EL elements 43r, 43g and 43b each emitting red, green or blue light disposed on the positive electrodes 42 (the organic EL element of the present invention is used as the red light emitting element 43r among these EL elements), and metal negative electrodes 44 located on the organic EL layer 43, and TFT circuit 45 for driving and controlling the respective positive electrodes 42 are connected thereto. On the substrate 41, a driving circuit 46 is also provided. In the circuit diagram shown in FIG. 5, the numerical reference 51 denotes a panel substrate, 52 denotes an EL element, 53 denotes a power source supply line, 54 denotes a data line, 55 denotes a scanning line, 56 denotes a TFT for driving, 57 denotes a TFT for switching, and 58 denotes a driving circuit. Each line with arrow from the organic EL element 52 is connected to a cathode (not shown).

EXAMPLES

The present invention will be described by way of examples which do not limit the present invention.

Synthesis Example 1

In this example, synthesis of 4,11-bis(phenylamino)zethrene is described.

Zethrene prepared by a synthesis method described in Journal of the American Chemical Society, vol. 90, page 530 (1968) was dissolved in carbon tetrachloride and 1 mol equivalent of bromine was added while cooling the solution. After the mixture was reacted for 4 hours, to thereby brominate zethrene, the brominated zethrene was purified by chromatography to obtain 4,11-dibromozethrene.

To the 4,11-dibromozethrene thus obtained, phenylamine, potassium carbonate and copper powder were added and the reaction was carried out at 200° C. for 30 hours. After the completion of the reaction, the reaction solution was diluted with water and the reaction product was extracted with chloroform. The extract was then purified by chromatography to obtain 4,11-bis(phenylamino)zethrene (Ph in the formula represents a phenyl group) represented by the following formula:

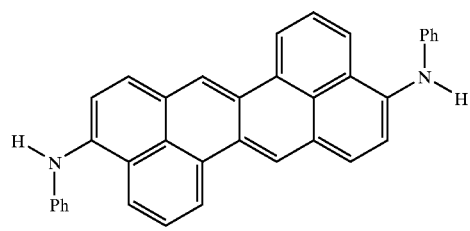

Synthesis Example 2

In this example, synthesis of 4,11-bis(diphenylamino)zethrene will be described.

In the same manner as in Synthesis Example 1,4,11-dibromozethrene was obtained. To the 4,11-dibromozethrene, diphenylamine, potassium carbonate and copper powder were added and the reaction was carried out at 200° C. for 30 hours. After the completion of the reaction, the reaction solution was diluted with water and the reaction product was extracted with chloroform. The extract was purified by chromatography to obtain 4,11-bis(diphenylamino)zethrene (Ph in the formula represents a phenyl group) represented by the following formula:

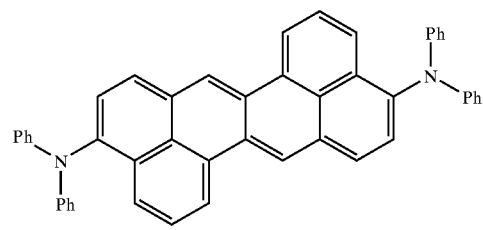

The following Examples 1 to 5 are directed to a multi-layer type organic EL element using 4,11-bis(phenylamino)zethrene obtained by the technique of Synthesis Example 1 described previously for a light emitting layer.

Example 1

In this example, a multi-layer type organic EL element using 4,11-bis(phenylamino)zethrene for a light emitting layer will be described.

Organic EL elements were produced by washing a glass substrate provided with ITO electrodes in turn with water, acetone and isopropyl alcohol and, using a vacuum deposition apparatus ($1 \times 10^{-6}$ torr, substrate temperature: room temperature), to deposit TPD to a thickness of 50 nm to form a hole transporting layer on the substrate, deposit 4,11-bis(phenylamino)zethrene to a thickness of 20 nm to form a light emitting layer thereon, deposit Alq to a thickness of 30 nm to form an electron transporting layer thereon, and deposit an Al—Li alloy (Li: 0.5% by weight) to a thickness of 50 nm to form an electrode thereon. The element corresponds to the organic EL element 1 described previously with reference to FIG. 1. When a voltage was applied to the elements using the ITO electrodes as positive electrodes and the Al—Li electrode as a negative electrode, red light emission was observed at a voltage of not less than 6 V and red light emission having emission luminance 300 cd/m$^2$ was observed at an applied voltage of 10 V.

Example 2

Also, in this example, a multi-layer type organic EL element using 4,11-bis(phenylamino)zethrene for a light emitting layer will be described.

Organic EL elements were produced by washing a glass substrate provided with ITO electrodes in turn with water, acetone and isopropyl alcohol and, using a vacuum deposition apparatus ($1\times10^{-6}$ torr, substrate temperature: room temperature), to deposit TPD to a thickness of 50 nm to form a hole transporting layer on the substrate, simultaneously deposit 4,11-bis(phenylamino)zethrene and Alq (deposition ratio=1 molecule of 4,11-bis(phenylamino)zethrene/99 molecules of Alq) to a thickness of 20 nm to form a light emitting layer thereon, deposit Alq to a thickness of 30 nm to form an electron transporting layer thereon and deposit an Al—Li alloy (Li: 0.5% by weight) to a thickness of 50 nm to form an electrode thereon. When a voltage was applied to the elements using the ITO electrode as positive electrodes and the Al—Li electrode as a negative electrode, red light emission was observed at a voltage of not less than 5 V and red light emission having emission luminance 1030 cd/m$^2$ was observed at an applied voltage of 10 V.

Example 3

Also, in this example, a multi-layer type organic EL element using 4,11-bis(phenylamino)zethrene for a light emitting layer will be described.

Organic EL elements were produced by washing a glass substrate provided with ITO electrodes in turn with water, acetone and isopropyl alcohol and, using a vacuum deposition apparatus ($1\times10^{-6}$ torr, substrate temperature: room temperature), to deposit TPD to a thickness of 50 nm to form a hole transporting layer on the substrate, simultaneously deposit 4,11-bis(phenylamino)zethrene, Alq and rubrene (deposition ratio=1 molecule of 4,11-bis(phenylamino) zethrene/94 molecules of Alq/5 molecules of rubrene) to a thickness of 20 nm to form a light emitting layer thereon, deposit Alq to a thickness of 30 nm to form an electron transporting layer thereon and depositing an Al—Li alloy (Li: 0.5% by weight) to a thickness of 50 nm to form an electrode -thereon. When a voltage was applied to the element using the ITO electrodes as positive electrodes and the Al—Li electrode as a negative electrode, red light emission was observed at a voltage of not less than 5 V and red light emission having emission luminance 1700 cd/m$^2$ was observed at an applied voltage of 10 V.

Example 4

In this example, a multi-layer type organic EL element using 4,11-bis(phenylamino)zethrene for a hole transporting layer-cum-light emitting layer will be described.

Organic EL elements were produced by washing a glass substrate provided with ITO electrodes in turn with water, acetone and isopropyl alcohol and, using a vacuum deposition apparatus ($1\times10^{-6}$ torr, substrate temperature: room temperature), to deposit 4,11-bis(phenylamino)zethrene to a thickness of 50 nm to form a hole transporting layer-cum-light emitting layer on the substrate, deposit Alq to a thickness of 50 nm to form an electron transporting layer thereon and deposit an Al—Li alloy (Li: 0.5% by -weight) to a thickness of 50 nm to form an electrode thereon. When a voltage was applied to the elements using the ITO electrodes as positive electrodes and the Al—Li electrode as a negative electrode, red light emission was observed at a voltage of not less than 5 V and red light emission having emission luminance 230 cd/m$^2$ was observed at an applied voltage of 10 V.

Example 5

In this example, a multi-layer type organic EL element using 4,11-bis(phenylamino)zethrene for an electron transporting layer-cum-light emitting layer will be described.

Organic EL elements were produced by washing a glass substrate provided with ITO electrodes in turn with water, acetone and isopropyl alcohol and, using a vacuum deposition apparatus ($1\times10^{-6}$ torr, substrate temperature: room temperature), to deposit TPD to a thickness of 50 nm to form a hole transporting layer on the substrate, deposit 4,11-bis (phenylamino)zethrene to a thickness of 30 nm to form an electron transporting layer-cum-light emitting layer and deposit an Al—Li alloy (Li: 0.5% by weight) to a thickness of 50 nm thereon. When a voltage was applied to the elements using the ITO electrodes as positive electrodes and the Al—Li electrode as a negative electrode, red light emission was observed at a voltage of not less than 6 V and red light emission having emission luminance 180 cd/m$^2$ was observed at an applied voltage of 10 V.

The following Examples 6 to 10 are directed to a multi-layer type organic EL element using 4,11-bis (diphenylamino)zethrene obtained by the technique of Synthesis Example 2 described previously for a light emitting layer.

Example 6

In this example, a multi-layer type organic EL element using 4,11-bis(diphenylamino)zethrene for a light emitting layer will be described.

Organic EL elements were produced by washing a glass substrate provided with ITO electrodes in turn with water, acetone and isopropyl alcohol and, using a vacuum deposition apparatus ($1\times10^{-6}$ torr, substrate temperature: room temperature), to deposit TPD to a thickness of 50 nm to form a hole transporting layer on the substrate, deposit 4,11-bis (diphenylamino)zethrene to a thickness of 20 nm to form a light emitting layer thereon, deposit Alq to a thickness of 30 nm to form an electron transporting layer thereon and deposit an Al—Li alloy (Li: 0.5% by weight) to a thickness of 50 nm to form an electrode thereon. When a voltage was applied to the elements using the ITO electrodes as positive electrodes and the Al—Li electrode as a negative electrode, red light emission was observed at a voltage of not less than 6 V and red light emission having emission luminance 420 cd/m$^2$ was observed at an applied voltage of 10 V.

Example 7

Also, in this example, a multi-layer type organic EL element using 4,1-bis(diphenylamino)zethrene for a light emitting layer will be described.

Organic EL elements were produced by washing a glass substrate provided with ITO electrodes in turn with water, acetone and isopropyl alcohol and, using a vacuum deposition apparatus ($1\times10^{-6}$ torr, substrate temperature: room temperature), to deposit TPD to a thickness of 50 nm to form a hole transporting layer on the substrate, simultaneously deposit 4,11-bis(diphenylamino)zethrene and Alq (deposition ratio=1 molecule of 4,11-bis(diphenylamino) zethrene/99 molecules of Alq) to a thickness of 20 nm to form a light emitting layer thereon, deposit Alq to a thickness of 30 nm to form an electron transporting layer thereon and deposit an Al—Li alloy (Li: 0.5% by weight) to a thickness of 50 nm to form an electrode thereon. When a voltage was applied to the elements using the ITO electrodes as positive electrodes and the Al—Li electrode as a negative electrode, red light emission was observed at a voltage of not less than 5 V and red light emission having emission luminance 1640 cd/m² was observed at an applied voltage of 10 V.

Example 8

Also, in this example, a multi-layer type organic EL element using 4,11-bis(diphenylamino)zethrene for a light emitting layer will be described.

Organic EL elements were produced by washing a glass substrate provided with ITO electrodes in turn with water, acetone and isopropyl alcohol and, using a vacuum deposition apparatus ($1\times10^{-6}$ torr, substrate temperature: room temperature), to deposit TPD to a thickness of 50 nm to form a hole transporting layer on the substrate, simultaneously deposit 4,11-bis(diphenylamino)zethrene, Alq and rubrene (deposition ratio=1 molecule of 4,1-bis(diphenylamino) zethrene/94 molecules of Alq/5 molecules of rubrene) to a thickness of 20 nm to form a light emitting layer thereon, deposit Alq to a thickness of 30 nm to form an electron transporting layer thereon and deposit an Al—Li alloy (Li: 0.5% by weight) to a thickness of 50 nm to form an electrode thereon. When a voltage was applied to the elements using the ITO electrodes as positive electrodes and the Al—Li electrode as a negative electrode, red light emission was observed at a voltage of not less than 5 V and red light emission having emission luminance 2000 cd/m² was observed at an applied voltage of 10 V.

Example 9

In this example, a multi-layer type organic EL element using 4,11-bis(diphenylamino)zethrene for a hole transporting layer-cum-light emitting layer will be described.

Organic EL elements were produced by washing a glass substrate provided with ITO electrodes in turn with water, acetone and isopropyl alcohol and, using a vacuum deposition apparatus ($1\times10^{-6}$ torr, substrate temperature: room temperature), to deposit 4,11-bis(diphenylamino)zethrene to a thickness of 50 nm to form a hole transporting layer-cum-light emitting layer on the substrate, deposit Alq to a thickness of 50 nm to form an electron transporting layer thereon and deposit an Al—Li alloy (Li: 0.5% by weight) to a thickness of 50 nm to form an electrode thereon. When a voltage was applied to the elements using the ITO electrodes as positive electrodes and the Al—Li electrode as a negative electrode, red light emission was observed at a voltage of not less than 5 V and red light emission having emission luminance 410 cd/M² was observed at an applied voltage of 10 V.

Example 10

In this example, a multi-layer type organic EL element using 4,11-bis(diphenylamino)zethrene for an electron transporting layer-cum-light emitting layer will be described.

Organic EL elements were produced by washing a glass substrate provided with ITO electrodes in turn with water, acetone and isopropyl alcohol and, using a vacuum deposition apparatus ($1\times10^{-6}$ torr, substrate temperature: room temperature), to deposit TPD to a thickness of 50 nm to form a hole transporting layer on the substrate, deposit 4,11-bis (diphenylamino)zethrene to a thickness of 30 nm to form an electron transporting layer-cum-light emitting layer and deposit an Al—Li alloy (Li: 0.5% by weight) to a thickness of 50 nm to form an electrode thereon. When a voltage was applied to the elements using the ITO electrodes as positive electrodes and the Al—Li electrode as a negative electrode, red light emission was observed at a voltage of not less than 6 V and red light emission having emission luminance 220 cd/m² was observed at an applied voltage of 10 V.

Industrial Applicability

As described above, an organic EL element of the invention comprising an organic light emitting layer made of a material comprising an arylaminozethrene compound can efficiently emit red light having high color purity, and therefore it can be effectively employed in various flat panel displays, including car audio displays, displays cell phones and others.

What is claimed is:

1. An organic EL element having a positive electrode, a negative electrode, and an organic light emitting layer located between the positive electrode and the negative electrode, characterized in that the material of the organic light emitting layer comprises an arylaminozethrene compound represented by the following general formula:

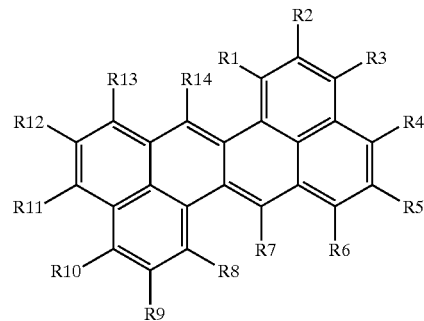

wherein at least one of R1 to R14 is an arylamino group represented by the following structural formula:

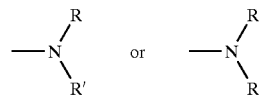

wherein R is a substituted or unsubstituted aromatic group having a single aromatic ring or a condensed aromatic ring with up to five rings, the substituent containing at least one kind of atom selected from carbon, oxygen, nitrogen and sulfur atoms in case of the substituted aromatic group, the total number of atoms other than hydrogen in the substituted aromatic group being not more than 25, and R' is hydrogen, halogen, —OH, —OCH₃, or an alkyl group having 1 to 10 carbon atoms, and, when the arylaminozethrene compound includes two or more arylamino groups, they may be the same or different, and groups other than the arylamino group among R1 to R14 independently represent hydrogen, halogen, —OH, —OCH₃, an alkyl group having 1 to 10 carbon atoms, or the substituted or unsubstituted aromatic group as aforementioned.

2. The organic EL element according to claim 1, wherein the arylamino group is a monoarylamino group.

3. The organic EL element according to claim 2, wherein an aryl substituent of the arylamino group is a phenyl group.

4. The organic EL element according to claim 1, wherein the arylamino group is a diarylamino group.

5. The organic EL element according to claim 1, wherein the arylaminozethrene compound comprises both a monoarylamino group and a diarylamino group as the arylamino group.

6. The organic EL element according to claim 1, wherein the material of the organic light emitting layer comprises 4,11-bis(phenylamino)zethrene, 4,1 1 -bis(diphenylamino) zethrene, or a mixture thereof.

7. The organic EL element according to claim 1, which has a hole transporting layer located between the positive electrode and the organic light emitting layer, and an electron transporting layer located between the negative electrode and the organic light emitting layer.

8. The organic EL element according to claim 1, wherein the organic light emitting layer doubles as an electron transporting layer, and wherein the element has a hole transporting layer between the organic light emitting layer doubling as the electron transporting layer and the positive electrode.

9. The organic EL element according to claim 1, wherein the organic light emitting layer doubles as a hole transporting layer, and wherein the element has an electron transporting layer between the organic light emitting layer doubling as the hole transporting layer and the negative electrode.

10. The organic EL element according to claim 1, wherein the material of the light emitting layer comprises at least one host material, in addition to the arylamninozethrene compound as a guest material.

11. The organic EL element according to claim 10, wherein the host material is an aluminum-quinolinol complex, or a mixture of an aluminum-quinolinol complex and rubrene.

12. An organic EL display using the organic EL element according to claim 1.

13. The organic EL display according to claim 12, which is a passive matrix panel display or an active matrix display.

14. An organic EL display comprising a substrate, an organic EL layer comprising an organic EL element according to claim 1 provided on the substrate, and a circuit for driving the organic EL element included in the organic EL layer.

* * * * *

UNITED STATES PATENT AND TRADEMARK OFFICE
CERTIFICATE OF CORRECTION

PATENT NO. : 6,773,832 B2
DATED : August 10, 2004
INVENTOR(S) : Wataru Sotoyama et al.

It is certified that error appears in the above-identified patent and that said Letters Patent is hereby corrected as shown below:

Column 14,
Line 58, delete "kind of".

Column 15,
Line 14, change "4.1 1" to -- 4.11 --.

Signed and Sealed this

Thirtieth Day of November, 2004

JON W. DUDAS
*Director of the United States Patent and Trademark Office*